(12) United States Patent
Derner et al.

(10) Patent No.: US 10,510,394 B2
(45) Date of Patent: *Dec. 17, 2019

(54) REPROGRAMMABLE NON-VOLATILE FERROELECTRIC LATCH FOR USE WITH A MEMORY CONTROLLER

(71) Applicant: Micron Technology, Inc., Boise, ID (US)

(72) Inventors: Scott James Derner, Boise, ID (US); Christopher John Kawamura, Boise, ID (US); Charles L. Ingalls, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/831,076

(22) Filed: Dec. 4, 2017

(65) Prior Publication Data

US 2018/0102158 A1 Apr. 12, 2018

Related U.S. Application Data

(63) Continuation of application No. 15/286,259, filed on Oct. 5, 2016, now Pat. No. 9,858,979.

(51) Int. Cl.
*G11C 11/22* (2006.01)

(52) U.S. Cl.
CPC ........ *G11C 11/2275* (2013.01); *G11C 11/221* (2013.01); *G11C 11/2273* (2013.01)

(58) Field of Classification Search
CPC .............. G11C 11/2275; G11C 11/221; G11C 11/2273

USPC ................................. 365/145, 154, 205, 148
See application file for complete search history.

(56) References Cited

U.S. PATENT DOCUMENTS

| | | | |
|---|---|---|---|
| 6,141,237 A | 10/2000 | Eliason et al. | |
| 6,411,540 B1 | 6/2002 | Ashikaga | |
| 6,487,103 B2* | 11/2002 | Yamamoto | G11C 11/22 365/145 |
| 6,707,702 B1* | 3/2004 | Komatsuzaki | G11C 14/00 365/145 |
| 6,947,310 B1 | 9/2005 | Marshall et al. | |
| 7,012,829 B2* | 3/2006 | Kawashima | G11C 11/22 365/145 |
| 7,453,714 B2 | 11/2008 | Lin et al. | |
| 7,733,681 B2 | 6/2010 | Miyamoto | |
| 8,416,598 B2 | 4/2013 | Summerfelt et al. | |
| 8,477,522 B2 | 7/2013 | Clinton et al. | |
| 9,786,345 B1* | 10/2017 | Thiruvengadam | G11C 11/221 |
| 9,812,204 B1* | 11/2017 | Yan | G11C 14/0072 |
| 10,056,129 B1* | 8/2018 | Sakurai | G11C 11/2257 |

(Continued)

*Primary Examiner* — Connie C Yoha
(74) *Attorney, Agent, or Firm* — Holland & Hart LLP

(57) ABSTRACT

Methods, systems, and apparatuses related to a reprogrammable non-volatile latch are described. A latch may include ferroelectric cells, ferroelectric capacitors, a sense component, and other circuitry and components related to ferroelectric memory technology. The ferroelectric latch may be independent from (or exclusive of) a main ferroelectric memory array. The ferroelectric latch may be positioned anywhere in the memory device. In some instances, a ferroelectric latch may be positioned and configured to be dedicated to single piece of circuitry in the memory device.

19 Claims, 11 Drawing Sheets

(56) References Cited

U.S. PATENT DOCUMENTS

| | | | | |
|---|---|---|---|---|
| 2003/0123276 A1* | 7/2003 | Yokozeki | ............... | G11C 14/00 365/145 |
| 2005/0254282 A1* | 11/2005 | Summerfelt | ........... | G11C 5/147 365/145 |
| 2006/0164877 A1* | 7/2006 | Miyamoto | .............. | G11C 11/22 365/145 |
| 2006/0215438 A1* | 9/2006 | Suzuki | .................... | G11C 11/22 365/145 |
| 2007/0147103 A1* | 6/2007 | Yamamura | .............. | G11C 11/22 365/145 |
| 2009/0303771 A1* | 12/2009 | Kang | ..................... | G11C 5/142 365/145 |
| 2012/0307545 A1 | 12/2012 | McAdams et al. | | |
| 2019/0051335 A1* | 2/2019 | Nagata | ..................... | G11C 7/08 |

* cited by examiner

REPROGRAMMABLE NON-VOLATILE FERROELECTRIC LATCH FOR USE WITH A MEMORY CONTROLLER

CROSS REFERENCE

The present Application for Patent is a continuation of U.S. patent application Ser. No. 15/286,259 by Derner et al., entitled "Reprogrammable Non-Volatile Ferroelectric Latch For Use With A Memory Controller," filed Oct. 5, 2016, now U.S. Pat. No. 9,858,979, issued Jan. 2, 2018, assigned to the assignee hereof, and is expressly incorporated by reference in its entirety herein.

BACKGROUND

The following relates generally to memory devices and more specifically to a reprogrammable non-volatile latch.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. FeRAM devices may be implemented in a number of different settings. But traditional device architectures, including those using DRAM, may not fully leverage the non-volatile properties of FeRAM devices.

BRIEF DESCRIPTION OF THE DRAWINGS

The disclosure herein refers to and includes the following figures.

DETAILED DESCRIPTION

Ferroelectric memory technology may provide a number of advantages over other memory technologies (e.g., DRAM). Notably, ferroelectric memory is both reprogrammable and non-volatile. In many memory devices that use ferroelectric technology, the ferroelectric memory cells may be found only in the main array of memory cells in the memory device. In such memory devices, if circuitry of the memory device, such as the memory controller, attempts to use ferroelectric memory cells, the circuitry may need to access the main array. Accessing the main array may add additional time to the operations being executed by the circuitry. For example, to write data to or read data from the main array may take additional clock cycles to accomplish when compared to accessing a more local memory.

To bring the ferroelectric memory technology (e.g., the ferroelectric memory cells), closer to the circuitry using the ferroelectric memory technology, a ferroelectric latch may be employed, as disclosed herein. The ferroelectric latch may use a concurrent true data state and a complement data state to support reliable storage and read performance across all process, voltage, and temperature (PVT) corners, and to protect the latch against noise and disturb mechanisms.

By way of example, a ferroelectric latch may be self-contained so that it may be placed anywhere within a memory device; and the latch may not need to exist near or within a main array of memory cells. As such, the ferroelectric latch may be positioned near other circuitry so that a device may use fewer clock cycles (e.g., time) for the circuitry to access the ferroelectric latch than the main array of memory cells. In some cases, the ferroelectric latch can be programmed as many times as the ferroelectric memory elements allow.

A ferroelectric latch may, for example, include four cells to store one bit of data. In these deployments, two memory cells may be used to store a true data state and two cells may be used to store a complement data state. Two of the ferroelectric cells may be used to provide a capacitive load during a read operation to increase the likelihood that a relatively large signal (as compared to deployments without a ferroelectric latch) is developed during a read operation.

Features of the disclosure introduced above are further described below in the context of a memory array. Features of the disclosure are then illustrated by and described with reference to apparatus diagrams, system diagrams, and flowcharts that relate to reprogrammable non-volatile latch.

Figure 1:
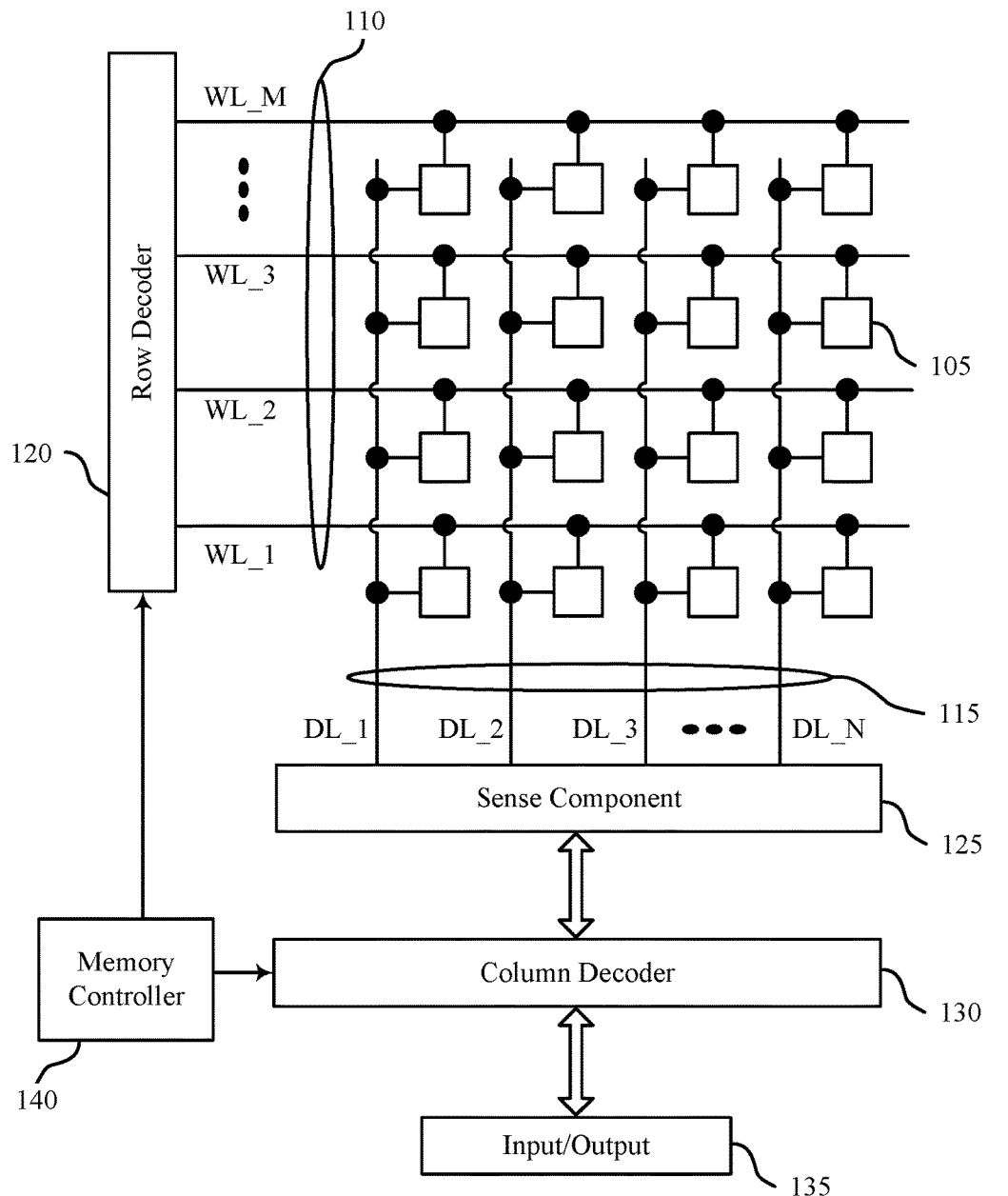
FIG. 1 illustrates an example of a memory array that supports a reprogrammable non-volatile latch in accordance with embodiments of the present disclosure.

FIG. 1 illustrates an example memory array 100 that supports a reprogrammable non-volatile latch in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 and digit line 115. Word lines 110 may also be referred to as access lines and digit lines 115 may also be referred to as bit lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic 1 and vice versa.

Sense component 125 may include various transistors or amplifiers in order to detect and amplify a difference in the signals, which may be referred to as latching. As described herein, a ferroelectric latch may be employed. The ferroelectric latch may include ferroelectric cells that may execute the same process as memory cells of the array 100, but the ferroelectric latch may be exclusive of the array of memory cells. The ferroelectric latch may provide for an increased signal for a read operation, relative to latches employing non-volatile memory cells, and may thus increase the reliability of read operations relative to other types of latches. A ferroelectric latch may therefore allow increased reliability with little or no increase in processing overhead because the ferroelectric material of the latch may be the same as the ferroelectric material of the cells 105 of array 100. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, ferroelectric memory cells 105 may have beneficial properties that may result in improved performance relative to other memory architectures.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltages used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
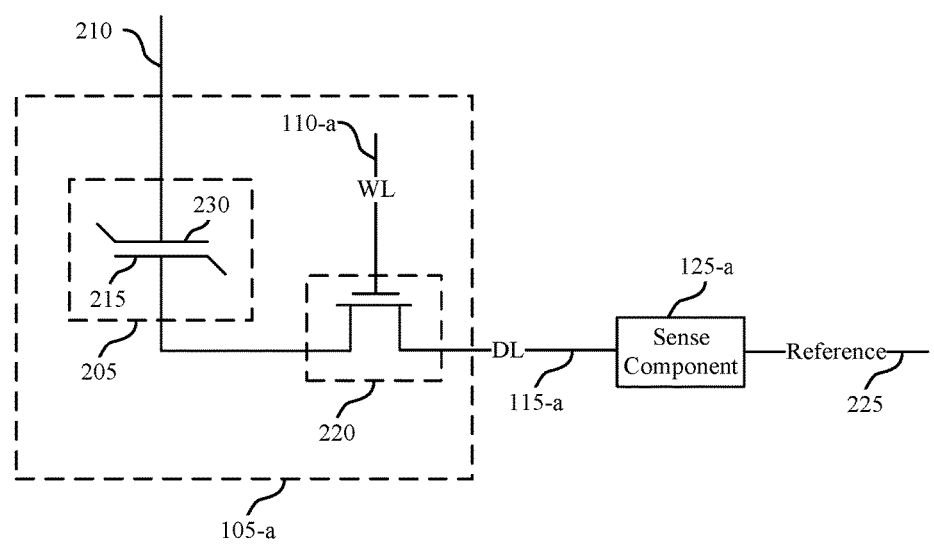
FIG. 2 illustrates an example circuit of a memory cell that supports a reprogrammable non-volatile latch in accordance with embodiments of the present disclosure.

FIG. 2 illustrates an example circuit 200 that supports a reprogrammable non-volatile latch in accordance with various embodiments of the present disclosure. Circuit 200 includes a memory cell 105-a, word line 110-a, digit line 115-a, and sense component 125-a, which may be examples of a memory cell 105, word line 110, digit line 115, and sense component 125, respectively, as described with reference to FIG. 1. Memory cell 105-a may include a logic storage component, such as capacitor 205 that has a first plate, cell plate 230, and a second plate, cell bottom 215. Cell plate 230 and cell bottom 215 may be capacitively coupled through a ferroelectric material positioned between them. The orientation of cell plate 230 and cell bottom 215 may be flipped without changing the operation of memory cell 105-a. Circuit 200 also includes selection component 220 and reference line 225. Cell plate 230 may be accessed via plate line 210 and cell bottom 215 may be accessed via digit line 115-a. As described above, various states may be stored by charging or discharging capacitor 205.

The stored state of capacitor 205 may be read or sensed by operating various elements represented in circuit 200. Capacitor 205 may be in electronic communication with digit line 115-a. For example, capacitor 205 can be isolated from digit line 115-a when selection component 220 is deactivated, and capacitor 205 can be connected to digit line 115-a when selection component 220 is activated. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate line 210 and cell plate 230 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. In one scheme, to sense the logic state stored by ferroelectric capacitor 205, word line 110-a may be biased to select memory cell 105 and a voltage may be applied to plate line 210. In some cases, digit line 115-a is virtually grounded and then isolated from the virtual ground, which may be referred to as "floating," prior to biasing plate line 210 and word line 110. Biasing plate line 210 may result in a voltage difference (e.g., plate line 210 voltage minus digit line 115 voltage) across capacitor 205. The voltage difference may yield a change in the stored charge on capacitor 205, where the magnitude of the change in stored charge may depend on the initial state of capacitor 205—e.g., whether the initial state stored a logic 1 or a logic 0. This may cause a change in the voltage of digit line 115-a based on the charge stored on capacitor 205. Operation of memory cell 105 by varying the voltage to cell plate 230 may be referred to as "moving cell plate."

The change in voltage of digit line 115-a may depend on its intrinsic capacitance. That is, as charge flows through digit line 115-a, some finite charge may be stored in digit line 115-a and the resulting voltage depends on the intrinsic capacitance. The intrinsic capacitance may depend on physical characteristics, including the dimensions, of digit line 115-a. Digit line 115-a may connect many memory cells 105-a so digit line 115-a may have a length that results in a non-negligible capacitance (e.g., on the order of picofarads (pF)). The resulting voltage of digit line 115-a may then be compared to a reference (e.g., a voltage of reference line 225) by sense component 125-a in order to determine the stored logic state in memory cell 105-a. Other sensing processes may be used.

Sense component 125-a may include various transistors or amplifiers to detect and amplify a difference in signals, which may be referred to as latching. Sense component 125-a may include a sense amplifier that receives and compares the voltage of digit line 115-a and reference line 225, which may be a reference voltage. The sense amplifier output may be driven to the higher (e.g., a positive) or lower (e.g., negative or ground) supply voltage based on the comparison. For instance, if digit line 115-a has a higher voltage than reference line 225, then the sense amplifier output may be driven to a positive supply voltage. In some cases, the sense amplifier may additionally drive digit line 115-a to the supply voltage.

Sense component 125-a may then latch the output of the sense amplifier and/or the voltage of digit line 115-a, which may be used to determine the stored state in memory cell 105, e.g., logic 1. Alternatively, if digit line 115-a has a lower voltage than reference line 225, the sense amplifier output may be driven to a negative or ground voltage. Sense component 125-a may similarly latch the sense amplifier output to determine the stored state in memory cell 105, e.g., logic 0. The latched logic state of memory cell 105-a may then be output, for example, through column decoder 130 as output 135 with reference to FIG. 1. As described herein, the latch may be a ferroelectric latch, which may include cells and additional capacitors that comprise the same ferroelectric material as cell 105-a. In some cases, the ferroelectric latch includes cells that are neighboring or adjacent to cell 105-a, but the cells of the ferroelectric latch may be exclusive of the array that comprises cell 105-a.

To write memory cell 105-a, a voltage may be applied across capacitor 205. Various methods may be used. In one example, selection component 220 may be activated through word line 110-a in order to electrically connect capacitor 205 to digit line 115-a. A voltage may be applied across capacitor 205 by controlling the voltage of cell plate 230 (through plate line 210) and cell bottom 215 (through digit line 115). To write a logic 0, cell plate 230 may be taken high, that is, a positive voltage may be applied to plate line 210, and cell bottom 215 may be taken low, e.g., virtually grounding or applying a negative voltage to digit line 115. The opposite process is performed to write a logic 1, where cell plate 230 is taken low and cell bottom 215 is taken high.

Figure 3:
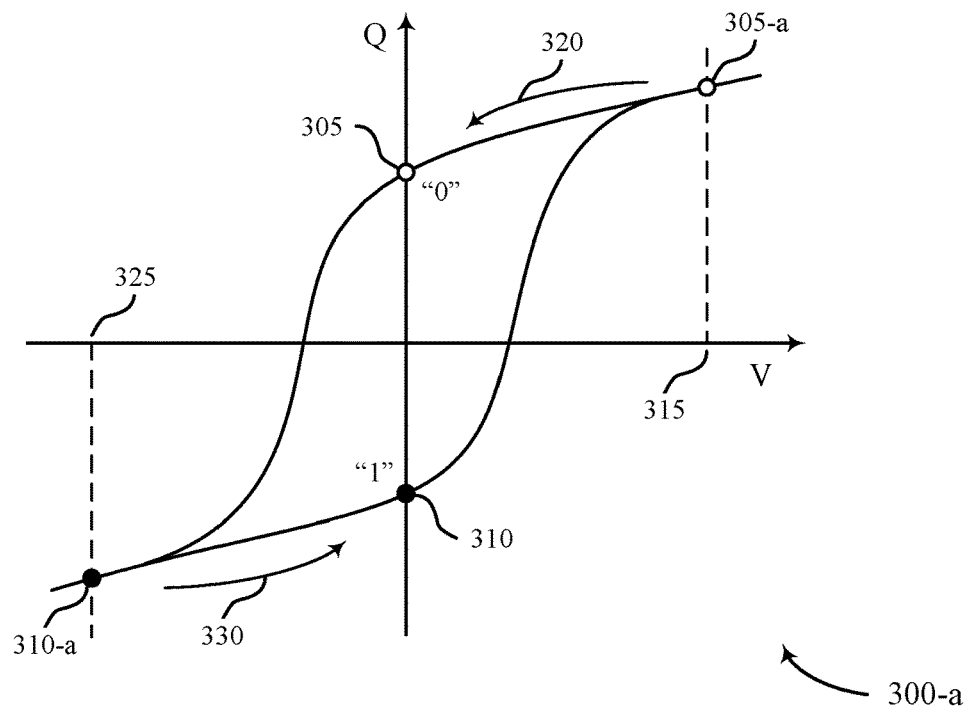
FIG. 3 illustrates an example of a hysteresis plot for a ferroelectric memory cell that supports a reprogrammable non-volatile latch in accordance with embodiments of the present disclosure.
Figure 3:
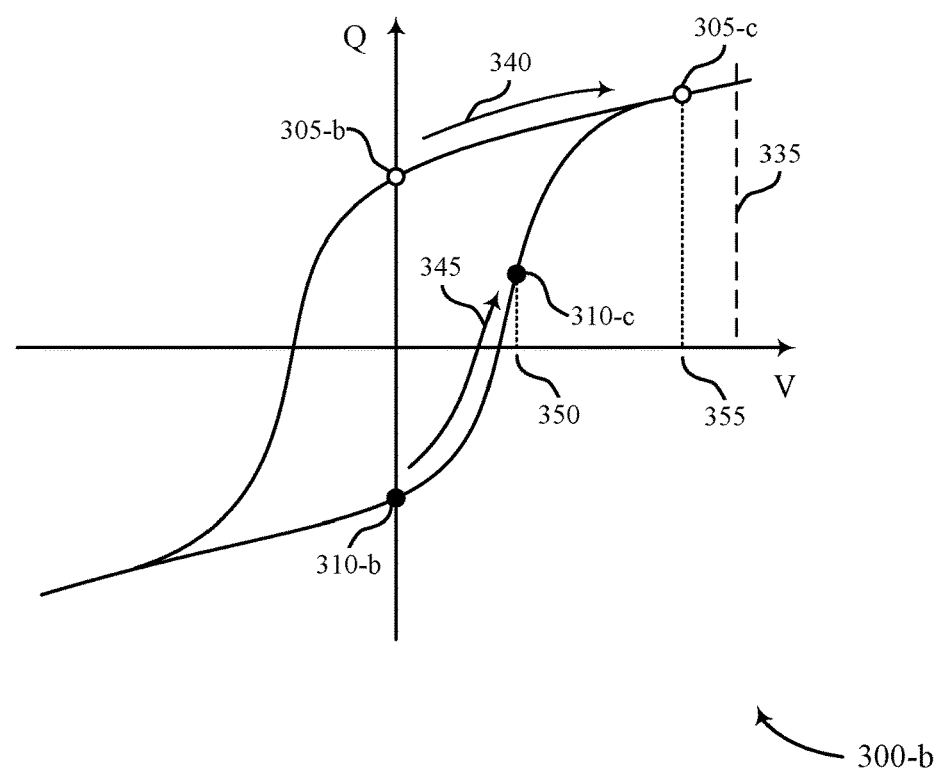

FIG. 3 illustrates an example of non-linear electrical properties with hysteresis curves 300-a and 300-b for a ferroelectric memory cell that is operated in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor 205 of FIG. 2) as a function of a voltage difference, V. The non-linear properties of ferroelectric materials illustrated in the example of FIG. 3 may give rise to the non-volatile nature of ferroelectric cells employed in a ferroelectric latch, and may thus illustrate some of the advantageous characteristics of a ferroelectric latch over a latch employing other cells constructed using different technologies or chemistries.

A ferroelectric material is characterized by a spontaneous electric polarization, i.e., it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell plate 230) and maintaining the second terminal (e.g., a cell bottom 215) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage. Similarly, charge state 310 is written by applying a net negative voltage 325, which results in charge state 310-a. After removing negative voltage 325, charge state 310-a follows path 330 until it reaches charge state 310 at zero voltage. Charge states 305-a and 310-a may also be referred to as the remnant polarization (Pr) values, i.e., the polarization (or charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-b or 310-b was initially stored. For example, hysteresis curve 300-b illustrates two possible stored charge states 305-b and 310-b. Voltage 335 may be applied across the capacitor as discussed with reference to FIG. 2. In other cases, a fixed voltage may be applied to the cell plate and, although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. So a voltage measured at a sense component may not equal voltage 335 and instead may depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor. The same functionality described above also may apply to the ferroelectric elements described in more detail below (e.g., the ferroelectric elements in the latch 505 or the memory array 410), even when the ferroelectric elements are not part of a memory array for dense data storage (e.g., the ferroelectric elements of the latch 505).

By comparing the digit line voltage to a reference voltage, the initial state of the capacitor may be determined. The digit line voltage may be the difference between voltage 335 and the final voltage across the capacitor, voltage 350 or voltage 355—i.e., (voltage 335-voltage 350) or (voltage 335-voltage 355). A reference voltage may be generated such that its magnitude is between the two possible voltages of the two possible digit line voltages in order to determine the stored logic state—i.e., if the digit line voltage is higher or lower than the reference voltage. For example, the reference voltage may be an average of the two quantities, (voltage 335-voltage 350) and (voltage 335-voltage 355). Upon comparison by the sense component, the sensed digit line voltage may be determined to be higher or lower than the reference voltage, and the stored logic value of the ferroelectric memory cell (i.e., a logic 0 or 1) may be determined.

As discussed above, reading a memory cell that does not use a ferroelectric capacitor may degrade or destroy the stored logic state. A ferroelectric memory cell, however, may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction.

Figure 4:
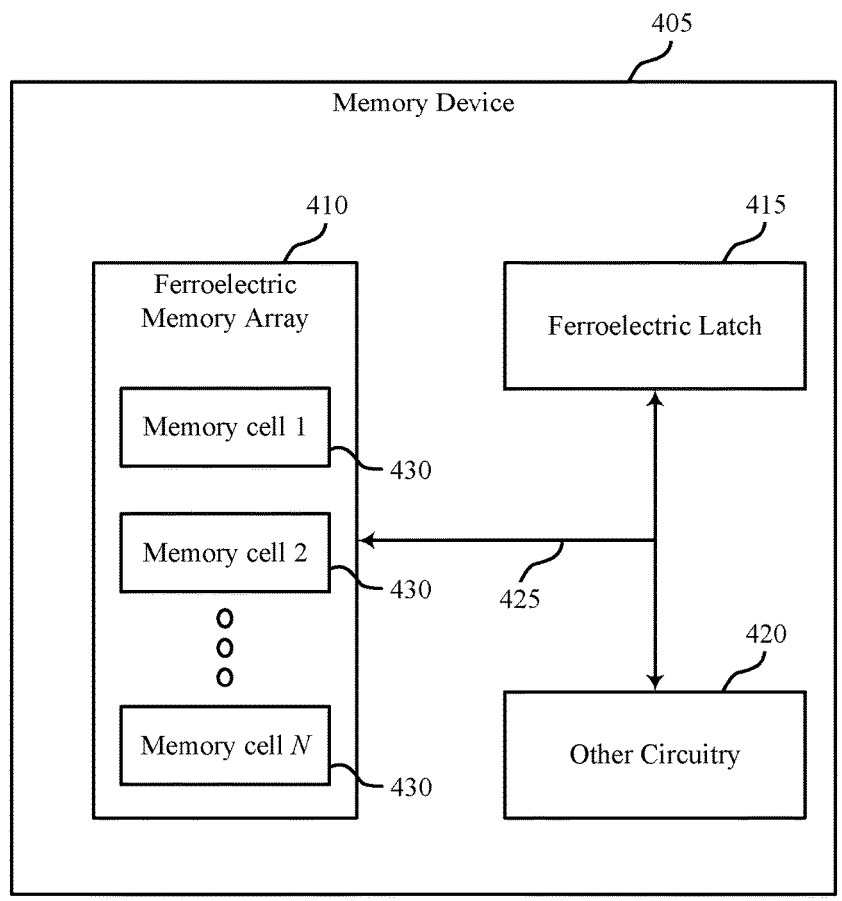
FIG. 4 illustrates an example of a block diagram of a memory device that includes a reprogrammable non-volatile latch in accordance with embodiments of the present disclosure.

FIG. 4 illustrates an example of a block diagram 400 of a memory device 405 that includes a robust, reprogrammable, non-volatile latch using ferroelectric memory elements. The memory device 405 may include a memory array 410, a latch 415, and other circuitry 420. The latch 415 may be a reprogrammable, non-volatile latch that is separate from the memory array 410. Thus, the latch 415 may be positioned away from the memory array 410 such that the latch 415 is positioned in a different location from the memory array 410 in the memory device 405. The memory array 410, the latch 415, and the other circuitry 420 may be in electronic communication via one or more communication lines 425.

The memory array 410 may be similar to the memory array 100 shown and described in reference to FIG. 1. The memory array 410 may include a plurality of memory cells 430. The memory cells 430 may comprise ferroelectric memory cells as discussed previously. The memory array 410 may be configured to store values for a host device (e.g., a personal computer) and the memory array 410 may be configured to store values for the operation of the memory device 405.

The other circuitry 420 may include any other circuit elements or components necessary to perform the functions of the memory device 405. For example, the other circuitry 420 may include a memory controller 140, 715 as shown and described in FIGS. 1 and 7 or other peripheral components. Elements of the other circuitry 420, from time to time, may store one or more values in a memory during an operation being performed by the element of the other circuitry. In some examples, the other circuitry 420 may store those values in the memory array 410 of the memory device 405. Such an arrangement, however, may add time to the operation being executed by the other circuitry 420. For example, if a memory controller stores a value in the memory array 410, it may take several clock cycles to transport that value via the communication lines 425 to the memory array 410 and get the value properly stored in the memory array 410.

In the illustrative example of FIG. 4, a latch 415 (or a plurality of latches) may be configured or positioned near the other circuitry 420 to fulfill the other circuitry's memory requirements. In this manner, the amount of time to store and retrieve data for use by the other circuitry 420 may be reduced. The latch 415 may include one or more ferroelectric memory elements. The latch 415 may be reprogrammable and non-volatile because of the characteristics of ferroelectric memory elements. In some examples, the latch 415 may be positioned to be near a particular circuit of the other circuitry 420. In such an example, the latch 415 may be configured to store values for that particular circuit of the other circuitry 420 exclusively. In some examples, the latch 415 may be configured to store values for a number of different circuits in the memory device 405.

In some examples, a plurality of ferroelectric latches 415 may be combined into a ferroelectric latch array. Such a ferroelectric latch array may be positioned independent of the main memory array of the memory device.

Figure 5:
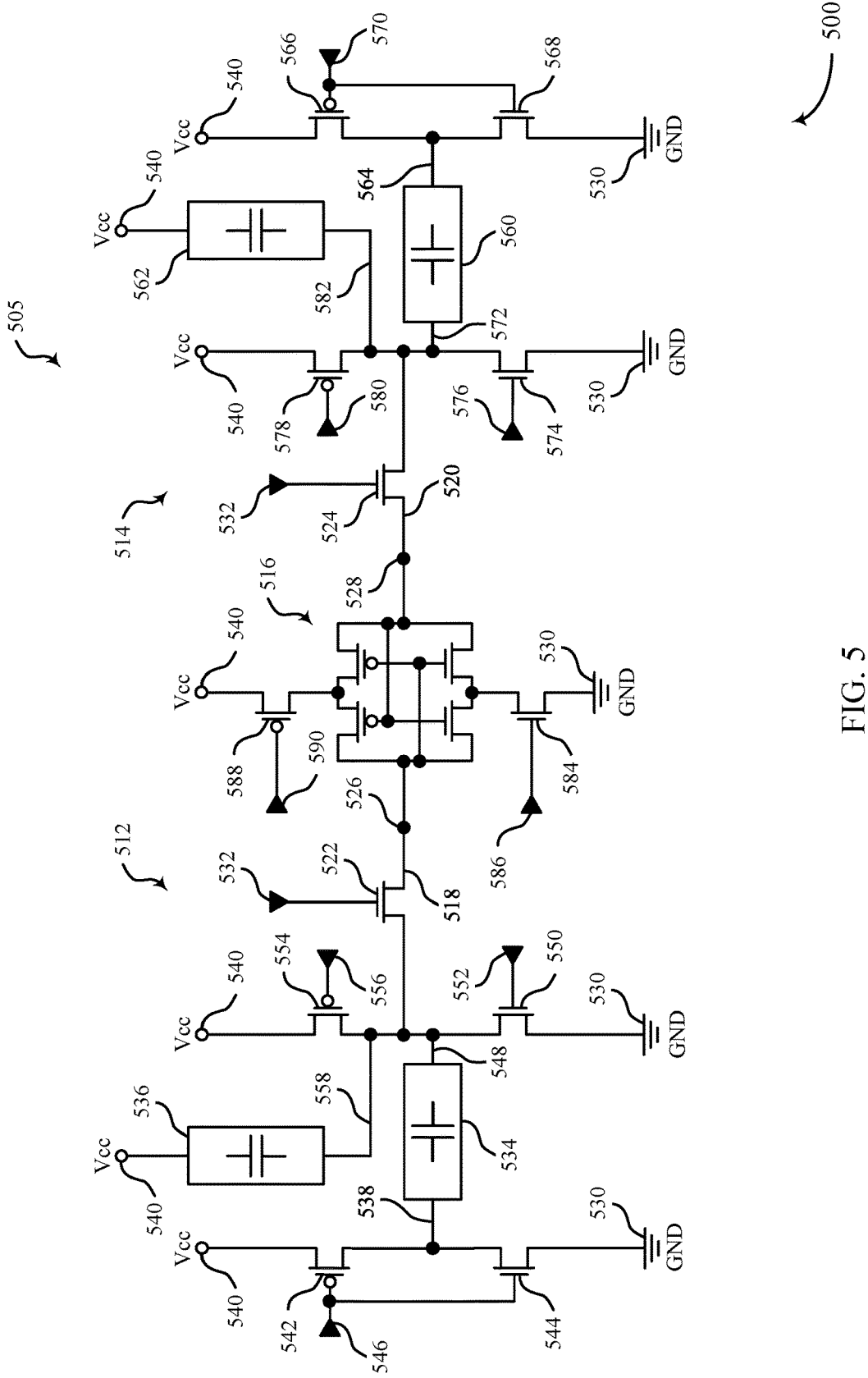
FIG. 5 illustrates an example of a circuit diagram of a reprogrammable non-volatile latch in accordance with embodiments of the present disclosure.

FIG. 5 illustrates a circuit diagram 500 of a latch 505. The latch 505 may be an example of or include the components of the latch 415 as described with reference to FIG. 4. The latch 505 may include a first memory component 512, a second memory component 514, and a sense component 516. The first memory component 512 may be configured to store a "true" value received by the latch 505 and the second memory component 514 may be configured to store a "complement" value received by the latch 505. For example, in a binary system, a true value being stored on the latch 505 may be a logic one and the complement value being stored on the latch 505 may be a logic zero. In some examples, the first memory component 512 may be referred to as the true memory element and the second memory component 514 may be referred to as the complement memory element. The first memory component 512 may be coupled to the sense component 516 via a first conductive line 518 and the second memory component 514 may be coupled to the sense component 516 via a second conductive line 520.

A first isolation component 522 may be positioned on the first conductive line 518 between the first memory component 512 and the sense component 516. A second isolation component 524 may be positioned on the second conductive line 520 between the second memory component 514 and the sense component 516. The isolation components 522, 524 may be transistors (e.g., a plurality of transistors) or other switching components that alter their state in response to a gate voltage. The isolation components 522, 524 may be configured to selectively isolate or connect the memory components 512, 514 to the sense component 516.

By way of example, during a pre-charge operation (i.e., an equalization operation), the isolation components 522, 524 may be activated such that the transistors are closed and permit current to flow along the conductive lines 518, 520. In this manner, a first node 526 of the sense component 516 and a second node 528 of the sense component 516 may be coupled to a ground node 530 or a virtual ground node during the pre-charge operation. In another example, during other operations, such as "write" operations, the isolation components 522, 524 may be deactivated such that the transistor are open and do not permit current to flow along the conductive lines 518, 520 between the memory components 512, 514 and the sense component 516. In this manner, during certain operations, the memory components 512, 514 may be electrically isolated from the sense component 516.

The isolation components 522, 524 may be controlled by a equalization/isolation (EQISO) reference signal 532. The EQISO reference signal 532 may comprise a voltage selectively applied to the gates of the transistors of the isolation components 522, 524. In some examples, the EQISO reference signal 532 may be controlled by a latch controller (e.g., latch controller 775, 815, 915 or memory controller 140, 715).

The first memory component 512 may include a first cell 534 and a first capacitor 536. The first cell 534 and the first capacitor 536 may both be ferroelectric devices such as ferroelectric capacitors. In some examples, the first cell 534 and the first capacitor 536 are similarly embodied as the memory cells 430 of the memory array 410. In some examples, the first cell 534 and the first capacitor 536 are made from the same material as the memory cells 430 of the memory array 410.

In some instances the, ferroelectric elements (e.g., cells 534, 560 and capacitors 536, 562) in the ferroelectric latch 505 may have different layouts or different features than the ferroelectric elements (e.g., the memory cells) in the memory array 410. For example, the cells 534, 560 and the capacitors 536, 562 in the ferroelectric latch 505 may have different capacitance values from the cells in the memory array 410. In some examples, the ferroelectric elements of the ferroelectric latch 505 and the ferroelectric elements of the memory array 410 may be produced using similar processing techniques at little additional manufacturing costs. In some examples, the features of a memory cell of the memory array 410 may be optimized for minimizing a footprint while the ferroelectric elements included in the ferroelectric latch 505 may be optimized for performance and reliability. The relative dimensions of the ferroelectric elements in the ferroelectric latch 505 may be similar to the relative dimensions of the ferroelectric elements in the memory array 410. The layouts of the ferroelectric elements in the ferroelectric latch 505 may be similar to the layouts of the ferroelectric elements in the memory array 410.

The first cell 534 may be coupled to a plate 538. The plate 538 may be coupled to a voltage source 540 via a switching component 542. In some examples, the voltage source 540 defines a voltage value, such as Vcc. The plate 538 may also be coupled to the ground node 530 or virtual ground node (e.g., Vss) via a switching component 544. The switching components discussed in this disclosure (e.g., switching components 542, 544, etc.) may be examples of p-type transistors and n-type transistors. Although the illustrative example of FIG. 5 show specific types of transistors being used, the techniques described herein may be implemented using other types of transistors or other types of switching components.

A p-type transistor may be activated when a logical zero (e.g., a ground or virtual ground voltage) is applied to its gate. An n-type transistor may be activated when a logical one (e.g., a positive voltage) is applied to its gate. The voltage applied to the transistors may be configured to satisfy a voltage threshold to activate their respective type of transistor. In some examples, a latch controller may coordinate the application of such voltages to the gates of the switching components to control the operations of the latch 505. For example, the switching components 542, 544 may both be activated by the same reference signal 546. Because in the illustrative example, the switching component 542 is a p-type transistor and the switching component 544 is an n-type transistor and their gates are tied to the same reference signal 546, only one of the switching components 542, 544 may be activated at a time. The features and functions described above regarding switching components 542, 544 may apply to other switching components described herein.

The first cell 534 may be coupled to the first conductive line 518 via a first access line 548 associated with the first cell 534. The first conductive line 518 may be coupled to a ground node 530 or a virtual ground node via a switching component 550. In some examples, the switching component 550 may be an example of an n-type transistor. The gate of the switching component 550 may be coupled to a reference signal 552. The reference signal 552 may be controlled by a latch controller (e.g., latch controller 775, 815, 915 or memory controller 140, 715) associated with the latch 505. The first conductive line 518 may be coupled to a voltage source 540 via a switching component 554. In some examples, the switching component 554 may be an example of a p-type transistor. The gate of the switching component 554 may be coupled to a reference signal 556. The reference signal 556 may be controlled by a latch controller (e.g., latch controller 775, 815, 915 or memory controller 140, 715) associated with the latch 505.

The first capacitor 536 may be an example of a ferroelectric capacitor. The first capacitor 536 may be configured to boost the signal received at the sense component 516 from the first cell 534 during a read operation. In some examples, the first capacitor 536 may be used to provide a capacitive load to read nodes to ensure that a large signal is developed during a read operation. The first capacitor 536 may be coupled to the voltage source 540. The first capacitor 536 may be coupled to the first conductive line 518 via a second access line 558. In some instances, the read operation executed on the latch 505 may be different than a read operation executed on a memory cell of the memory array 410. For example, the read operation executed on the latch 505 may be self-referenced (e.g., the complement information stored on the second memory component 514), while the read operation on a memory cell of the memory array 410 may compare the memory cell's signal to a reference signal. In some examples, a true value may be sensed from a memory component (e.g., the first memory component 512) and a complement value may be sensed from a memory component (e.g., the second memory component 514) during a read operation executed on the latch 505.

The second memory component 514 may be similar to the first memory component 512. As such, the second memory component 514 may perform similar functions as described with reference to the first memory component 512. Features of the second memory component 514 having similar positions and serving similar functions as features of the first memory component 512 may thus be embodied similarly.

The second memory component 514 includes a second cell 560 and a second capacitor 562. The second cell 560 and the second capacitor 562 may be embodied similarly as the first cell 534 and the first capacitor 536. The second cell 560 and the second capacitor 562 may be examples of ferroelectric elements such as ferroelectric capacitors. In some examples, the second cell 560 and the second capacitor 562 are made from the same material as the memory cells 430 of the memory array 410. In some examples, the second cell 560 and the second capacitor 562 have the same or similar characteristics (e.g., dimensions, capacitance values, layout) as the first cell 534 and the first capacitor 536.

The second cell 560 may be coupled to a plate 564. The plate 564 may be coupled to the voltage source 540 via a switching component 566. The plate 564 may also be coupled to the ground node 530 or virtual ground node (e.g., Vss) via a switching component 568. The switching components 566, 568 may both be activated by a reference signal 570. In some examples, a latch controller (e.g., latch controller 775, 815, 915 or memory controller 140, 715) may coordinate the application of voltages to the gates of the switching components 566, 568 to control the operations of the latch 505. In the illustrative example of FIG. 5, the switching component 566 is a p-type transistor and the switching component 568 is an n-type transistor; their gates may be tied to the same reference signal 570, and one of the switching components 566, 568 may be activated at a time.

The second cell 560 may be coupled to the second conductive line 520 via a third access line 572 associated with the second cell 560. The second conductive line 520 may be coupled to a ground node 530 or a virtual ground node via a switching component 574. In some examples, the switching component 574 may be an example of an n-type transistor. The gate of the switching component 574 may be coupled to a reference signal 576. The reference signal 576 may be controlled by a latch controller (e.g., latch controller 775, 815, 915 or memory controller 140, 715) associated with the latch 505. The second conductive line 520 may be coupled to the voltage source 540 via a switching component 578. In some examples, the switching component 578 may be an example of a p-type transistor. The gate of the switching component 578 may be coupled to a reference signal 580. The reference signal 580 may be controlled by a latch controller (e.g., latch controller 775, 815, 915 or memory controller 140, 715) associated with the latch 505.

The second capacitor 562 may be an example of a ferroelectric capacitor. The second capacitor 562 may be configured to boost the signal received at the sense component 516 from the second cell 560 during a read operation. In some examples, the second capacitor 562 may be used to provide a capacitive load to read nodes to ensure that a large signal sis developed during a read operation. The second capacitor 562 may be coupled to the voltage source 540. The second capacitor 562 may be coupled to the second conductive line 520 via a fourth access line 582.

In some examples, the cells 534, 560 and the capacitors 536, 562 may be manufactured as part of the same ferroelectric capacitor element. For example, the cells 534, 560 and the capacitors 536, 562 may be sub-portions of the same ferroelectric capacitor. During manufacturing of a ferroelectric element, such as a capacitor, it may be advantageous to produce multiple ferroelectric elements at once in an array or a strip. In some examples, a single ferroelectric element may be manufactured and each of the cells 534, 560 and capacitors 536, 562 may be part of that single ferroelectric element. In some examples, the first cell 534 and the first capacitor 536 are included in a first ferroelectric capacitor element and the second cell 560 and the second capacitor 562 are included in a second ferroelectric capacitor element separate from the first ferroelectric capacitor element. In some examples, the ferroelectric elements of the memory array 410 (e.g., ferroelectric memory cells) may be exclusive of the first cell 534, first capacitor 536, the second cell 560, and the second capacitor 562.

The sense component 516 is coupled to both the first memory component 512 and the second memory component 514. The sense component 516 may be an example of sense component 125, 735 shown and described in FIGS. 1, 2, and 7. In some examples, the sense component 516 may be a sense amplifier. The sense component 516 may include an arrangement of switching components, such as transistors, to perform the functions described herein. The sense component 516 may be configured to receive stored values or signals from one or both of the first memory component 512 and the second memory component 514, amplify the signals and output a stored value of the latch 505 to other circuitry (e.g., the memory array 410 or the memory controller 140, 715) of the memory device. In some examples, the sense component 516 amplifies a value of the signal representing the stored value prior to outputting the stored value. In some examples, the stored value generated by the sense component 516 may be output to the other circuitry of the memory device at the first node 526.

The sense component 516 may be coupled to a ground node 530 or virtual ground node via a switching component 584. The switching component 584 may be an example of an n-type transistor. The gate of the switching component 584 may be coupled to a reference signal 586. The reference signal 586 may be controlled by a latch controller (e.g., latch controller 775, 815, 915 or memory controller 140, 715) associated with the latch 505. The sense component 516 may be coupled to the voltage source 540 via a switching component 588. The switching component 588 may be an example of a p-type transistor. The gate of the switching component 588 may be coupled to a reference signal 590. The reference signal 590 may be controlled by a latch controller (e.g., latch controller 775, 815, 915 or memory controller 140, 715) associated with the latch 505. In some examples, the reference signal 590 is the complement of the reference signal 586. Meaning, if the reference signal 586 represents a logical one, the reference signal 590 may represent a logical zero. With this arrangement of the reference signals 586, 590, the illustrative switching components 584, 588 may both be activated and deactivated at the same time.

Figure 6:
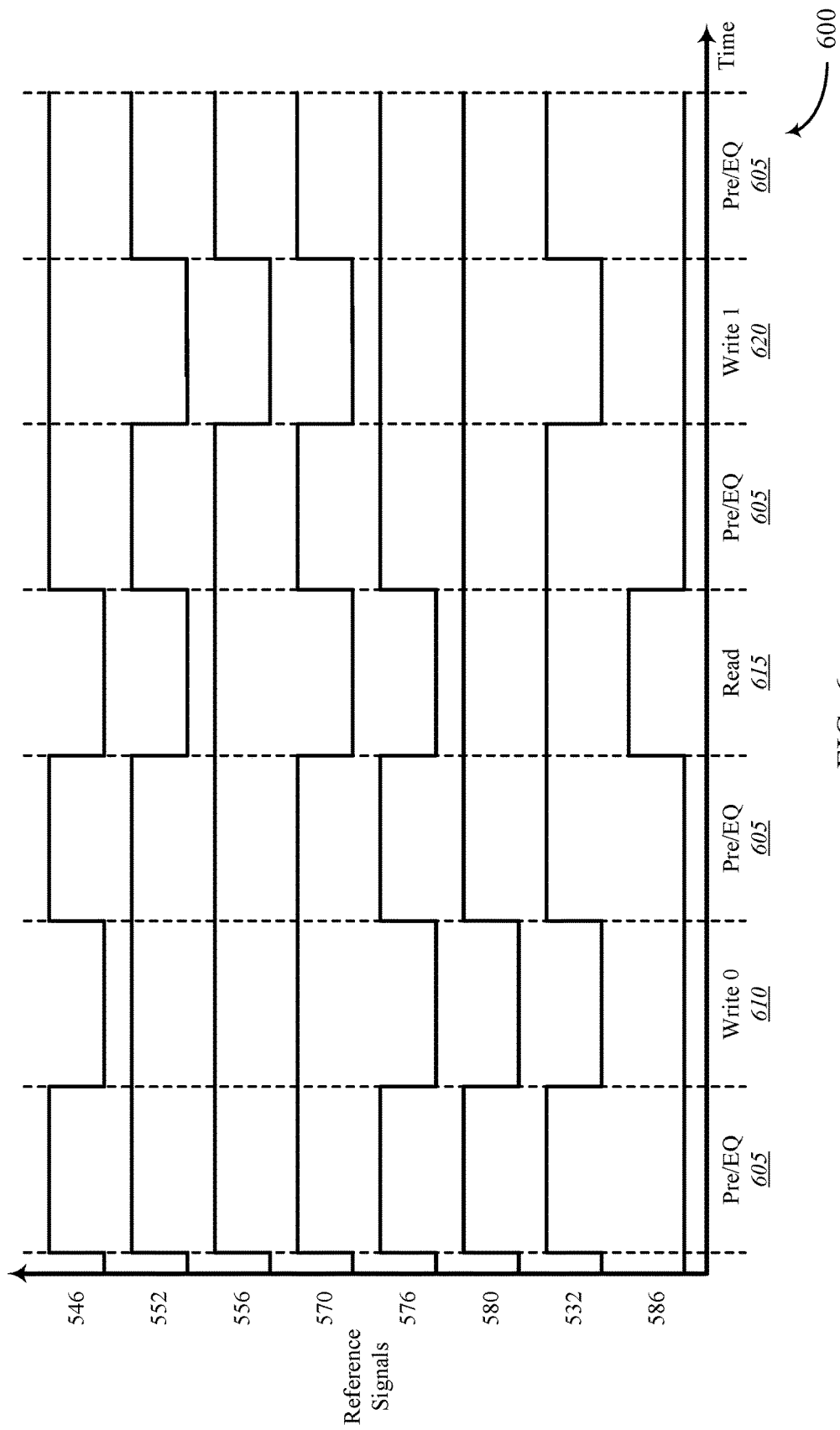
FIG. 6 illustrates an example of a timing diagram for a reprogrammable non-volatile latch in accordance with embodiments of the present disclosure.

FIG. 6 illustrates an example of a timing diagram 600 for a ferroelectric latch in accordance with various embodiments of the present disclosure. The timing diagram 600 illustrates a number of reference signals associated with the latch 505. For example, the values for the reference signals 532, 546, 552, 556, 570, 576, 580, 586 are illustrated in FIG. 6. The reference signal 590 is not depicted in the timing diagram 600 because the reference signal 590 is merely the complement of the reference signal 586 and may be derived based at least in part on an understanding of the values of the reference signal 586.

The timing diagram 600 may illustrate a number of operations that the latch 505 may execute. For example, the latch 505 may include a pre-charge/equalization operation 605 (Pre/EQ operation 605), a write zero operation 610, a read operation 615, and a write one operation 620. The operations discussed herein are for illustrative purposes, the latch 505 may execute other operations to perform the functions of the latch 505. The reference signals in the timing diagram 600 depict one of either two conditions: a high voltage value (e.g., a logical one) or a low voltage value (e.g., a logical zero). The low voltage value may be set at zero volts or may be set at a value determined by a virtual ground. The high voltage value may be set at some voltage that is greater than the low voltage value. In some examples, the high voltage value satisfies a certain threshold and the low voltage value satisfies a different threshold. The reference signals are plotted over time.

The Pre/EQ operation 605 may place the latch 505 in a neutral state for a subsequent access operation (e.g., a read operation or a write operation). For example, after latch 505 undergoes a Pre/EQ operation 605, the various nodes of latch 505 may be at zero volts or virtual ground. The Pre/EQ operation 605 includes activating and deactivating various switching components of the latch 505. In some examples, the Pre/EQ operation 605 may be executed before any other operation is executed (e.g., before an access operation is executed).

During the Pre/EQ operation 605, the reference signals 532, 546, 552, 556, 570, 576, 580 are set to the high voltage value and the reference signal 586 is set to the low voltage value. The reference signal values cause certain switching components to be activated (i.e., the switching component is closed such that it allows current to pass through the switching component) and others to be deactivated (i.e., the switching component is open such that it does not allow current to pass through the switching component). During the Pre/EQ operation 605, the switching components 522, 524, 544, 550, 568, 574 are activated and the switching components 542, 554, 566, 578, 584, 588 are deactivated. In this manner, the plates 538, 564 and the access lines 548, 572 may be coupled to the ground node 530 or the virtual ground node.

The write zero operation 610 may enable the latch 505 to write a true value of a logical zero at one of the memory components (e.g., the first memory component 512 or the second memory component 514). One of the memory components stores a true value, while the other memory component stores a complement value of the true value. In the illustrative example, the first memory component 512 is configured to store the true value and the second memory component 514 is configured to store the complement value of the true value. In some examples, the latch 505 receives both the true value and the complement value from the other circuitry requesting to write to the latch 505. In some examples, the latch 505 receives the true value and determines the complement value based at least in part on the received true value. During the write zero operation 610, a logical zero is being stored as the true value in the first memory component 512. As such, a logical one is being stored as the complement value in the second memory component 514. In some examples, the second memory component may store the true value and the first memory component may store the complement value.

To store a value in the memory components 512, 514, the respective cells 534, 560 may be biased based at least in part on the true value being stored to the latch 505. During the write zero operation 610, the reference signals 552, 556, 570 are set to the high voltage value and the reference signals 532, 546, 576, 580, 586 are set to the low voltage level. Consequently, during the write zero operation 610, the switching components 542, 550, 568, 578 are activated and switching components 522, 524, 544, 554, 566, 574, 584, 588 are deactivated. Such a configuration of reference signals, may cause the cells 534, 560 to be biased in particular manners such that a logical zero is stored in the first cell 534 and a logical one is stored in the second cell 560. During the write zero operation 610, the plate 538 and the third access line 572 may be coupled to the voltage source 540 and the first access line 548 and the plate 564 may be coupled to the ground node 530 or the virtual ground node. The isolation components 522, 524 may be deactivated to isolate the sense component 516 from the memory components 512, 514 during the write zero operation 610.

The read operation 615 may enable the latch 505 to read a true value stored by the latch 505. During the read operation 615, the sense component 516 may sense a first value form the first memory component 512 and may sense a second value from the second memory component 514. A stored value of the latch 505 may be determined (e.g., by the sense component 516) and output to other circuitry (e.g., the memory array 410 or the memory controller 140, 715) of the memory device. In some examples, the stored value that is output is based at least in part on the first value and the second value. In some examples, the stored value may be based at least in part on the first value alone.

During the read operation 615, the reference signals 532, 556, 580, 586 are set to the high voltage value and the reference signals 546, 552, 570, 576, 590 are set to the low voltage level. Consequently, during the read operation 615, the switching components 522, 524, 542, 566, 584, 588 are activated and switching components 544, 550, 554, 568, 574, 578 are deactivated. Such a configuration of reference signals, may cause the values stored on the respective memory components 512, 514 to be read and output from the latch 505. During the read operation 615, the plates 538, 564 may be coupled to the voltage source 540, the first access line 548 may be coupled to the sense component 516 via the first conductive line 518, and the third access line 572 may be coupled to the sense component 516 via the second conductive line 520. Such an arrangement may cause a voltage to be applied to the cells 534, 560 during the read operation. During the read operation 615, the access lines 558, 582 of the capacitors 536, 562 may be coupled to the sense component 516 via the isolation components 522, 524 and may contribute to the signals received by the sense component 516. The isolation components 522, 524 may be activated during the read operation 615 to couple the sense component 516 to the memory components 512, 514. In some examples, the stored value may be output to the other circuitry (e.g., the memory array 410 or the memory controller 140, 715) from the first conductive line 518 near the first node 526.

The write one operation 620 may enable the latch 505 to write a true value of a logical one at one of the memory components (e.g., the first memory component 512 or the second memory component 514). During the write one operation 620, a logical one is being stored as the true value in the first memory component 512. As such, a logical zero is being stored as the complement value in the second memory component 514.

During the write one operation 620, the reference signals 546, 576, 580, are set to the high voltage value and the reference signals 532, 552, 556, 570, 586 are set to the low voltage level. Consequently, during the write one operation 620, the switching components 544, 554, 566, 574 are activated and switching components 522, 524, 542, 554, 568, 578, 584, 588 are deactivated. Such a configuration of reference signals, may cause the cells 534, 560 to be biased in particular manners such that a logical one is stored in the first cell 534 and a logical zero is stored in the second cell 560. During the write one operation 620, the first access line 548 and the plate 564 may be coupled to the voltage source 540 and the plate 538 and the third access line 572 may be coupled to the ground node 530 or the virtual ground node. The isolation components 522, 524 may be deactivated to isolate the sense component 516 from the memory components 512, 514 during the write one operation 620.

Figure 7:
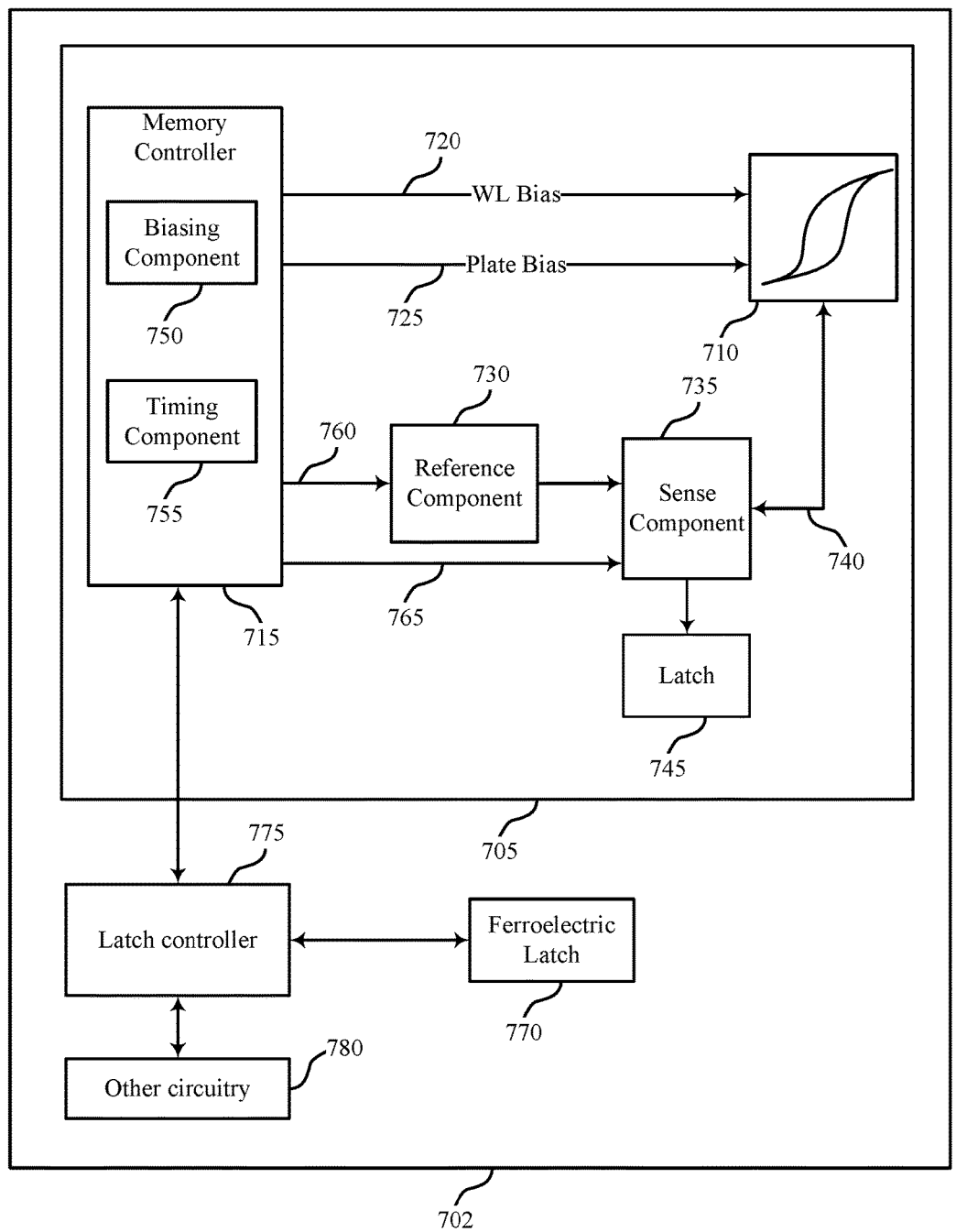
FIGS. 7 through 8 show block diagrams of a device that supports a reprogrammable non-volatile latch in accordance with embodiments of the present disclosure.

FIG. 7 shows a block diagram 700 of a memory device 702 and a memory array 705 that supports a reprogrammable non-volatile latch in accordance with various embodiments of the present disclosure. Memory array 705 may be referred to as an electronic memory apparatus, and may be an example of a component of a memory controller 140 as described with reference to FIG. 1.

Memory array 705 may include one or more memory cells 710, a memory controller 715, a word line 720, a plate line 725, a reference component 730, a sense component 735, a digit line 740, and a latch 745. These components may be in electronic communication with each other and may perform one or more of the functions described herein. In some cases, memory controller 715 may include biasing component 750 and timing component 755.

Memory controller 715 may be in electronic communication with word line 720, digit line 740, sense component 735, and plate line 725, which may be examples of word line 110, digit line 115, sense component 125, and plate line 210 described with reference to FIGS. 1, and 2. Memory array 705 may also include reference component 730 and latch 745. The components of memory array 705 may be in electronic communication with each other and may perform functions described with reference to FIGS. 1 through 6. In some cases, reference component 730, sense component 735, and latch 745 may be components of memory controller 715.

In some examples, digit line 740 is in electronic communication with sense component 735 and a ferroelectric capacitor of ferroelectric memory cells 710. A ferroelectric memory cell 710 may be writable with a logic state (e.g., a first or second logic state). Word line 720 may be in electronic communication with memory controller 715 and a selection component of ferroelectric memory cell 710. Plate line 725 may be in electronic communication with memory controller 715 and a plate of the ferroelectric capacitor of ferroelectric memory cell 710. Sense component 735 may be in electronic communication with memory controller 715, digit line 740, latch 745, and reference line 760. Reference component 730 may be in electronic communication with memory controller 715 and reference line 760. Sense control line 765 may be in electronic communication with sense component 735 and memory controller 715. These components may also be in electronic communication with other components, both inside and outside of memory array 705, in addition to components not listed above, via other components, connections, or busses.

Memory controller 715 may be configured to activate word line 720, plate line 725, or digit line 740 by applying voltages to those various nodes. For example, biasing component 750 may be configured to apply a voltage to operate memory cell 710 to read or write memory cell 710 as described above. In some cases, memory controller 715 may include a row decoder, column decoder, or both, as described with reference to FIG. 1. This may enable memory controller 715 to access one or more memory cells 105. Biasing component 750 may also provide voltages to reference component 730 in order to generate a reference signal for sense component 735. Additionally, biasing component 750 may provide voltages for the operation of sense component 735.

In some cases, memory controller 715 may perform its operations using timing component 755. For example, timing component 755 may control the timing of the various word line selections or plate biasing, including timing for switching and voltage application to perform the memory functions, such as reading and writing, discussed herein. In some cases, timing component 755 may control the operations of biasing component 750.

Reference component 730 may include various components to generate a reference signal for sense component 735. Reference component 730 may include circuitry configured to produce a reference signal. In some cases, reference component 730 may be implemented using other ferroelectric cells 105. Sense component 735 may compare a signal from memory cell 710 (through digit line 740) with a reference signal from reference component 730. Upon determining the logic state, the sense component may then store the output in latch 745, where it may be used in accordance with the operations of an electronic device that memory array 705 is a part. Sense component 735 may include a sense amplifier in electronic communication with the latch and the ferroelectric memory cell.

Memory controller 715 may be an example of the latch controller 915 described with reference to FIG. 9.

Memory controller 715 may receive a first value from a memory array that includes a set of ferroelectric memory cells, receive a second value from the memory array, where the second value is a complement of the first value, write the first value to a first ferroelectric cell that is coupled to a first node of a sense component, and write the second value to a second ferroelectric cell that is coupled to a second node of the sense component, where the first ferroelectric cell and the second ferroelectric cell each include a same ferroelectric memory material as the set of ferroelectric memory cells of the memory array.

The memory device 702 may also include a ferroelectric latch 770. The ferroelectric latch 770 may be an example of a ferroelectric latch 415 or latch 505 described with reference to FIGS. 4 and 5. The ferroelectric latch 770 may be separate from an array of memory cells that includes 710 and may thus be exclusive of other ferroelectric memory cells of the array. The ferroelectric latch 770 may be controlled by a latch controller 775. The latch controller 775 may be an example of the memory controller 140 or 715 described with reference FIGS. 1 and 7. As such, the latch controller 775 may include many of the same features as the memory controller 140 or 715 and may be configured to perform the same or similar functions as described herein. The latch controller 775 may be configured to control the operations of the ferroelectric latch 745 according to instructions received from hosting circuitry (e.g., the memory array 705 or other circuitry 780). In some examples, the ferroelectric latch 770 may be controller directly by the memory controller 715. In some examples, the ferroelectric latch 770 may be utilized and controlled by other circuitry 780. The other circuitry 780 may be an example of the other circuitry 420 described with reference to FIG. 4. The latch controller 775 may receive commands, requests, or data from hosting circuitry (e.g., the memory controller 715 or the other circuitry 780) and communicate commands and/or data with the ferroelectric latch 770.

Figure 8:
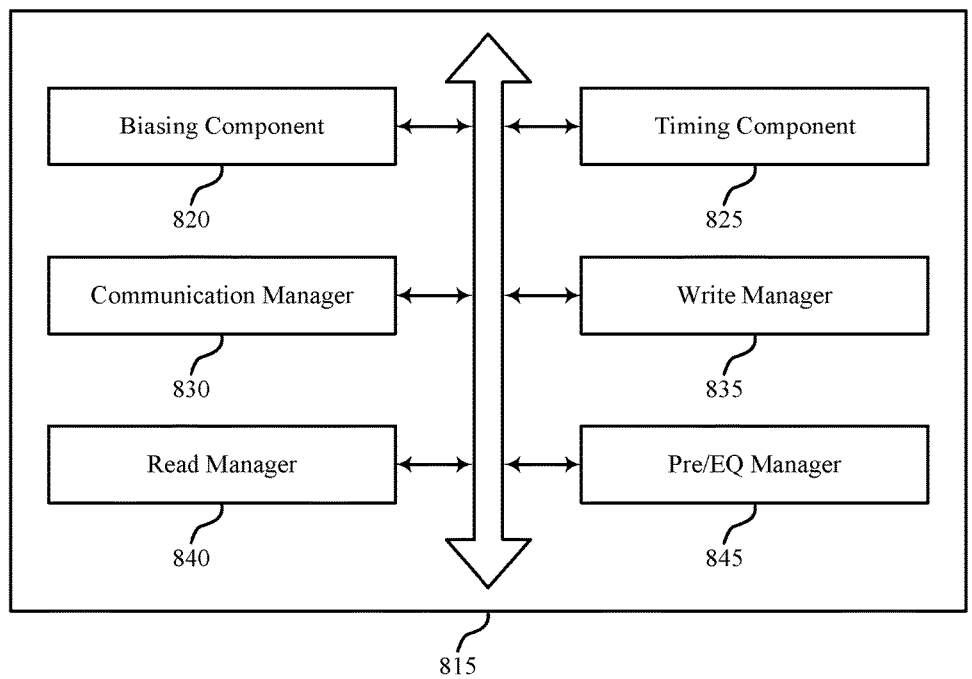

FIG. 8 shows a block diagram 800 of a latch controller 815 that supports a reprogrammable non-volatile latch in accordance with various embodiments of the present disclosure. The latch controller 815 may be an example of a latch controller 775 described with reference to FIG. 7 or a memory controller 140, 715, and 915 described with reference to FIGS. 1, 7, and 9. The latch controller 815 may include biasing component 820, timing component 825, communication manager 830, write manager 835, read manager 840, and Pre/EQ manager 845. Each of these modules may communicate, directly or indirectly, with one another (e.g., via one or more buses).

Communication manager 830 may receive a first value from a memory array that includes a set of ferroelectric memory cells, receive a second value from the memory array, where the second value is a complement of the first value, and output a stored value determined by the sense component to the memory array, where the stored value is based on the first value and the second value. In some cases, the stored value is output to the memory array at a conductive line positioned between the first ferroelectric cell and the sense component.

Write manager 835 may write the first value to a first ferroelectric cell that is coupled to a first node of a sense component, write the second value to a second ferroelectric cell that is coupled to a second node of the sense component, where the first ferroelectric cell and the second ferroelectric cell each include a same ferroelectric memory material as the set of ferroelectric memory cells of the memory array, couple an access line of the first ferroelectric cell to a ground node or virtual ground node via a second switching component, couple an access line of the second ferroelectric cell to a voltage source via a second switching component, isolate the first ferroelectric cell from the sense component via a first isolation component while writing the first value, and isolate the second ferroelectric cell from the sense component via a second isolation component while writing the second value. In some cases, writing the first value further includes: coupling a plate of the first ferroelectric cell to a voltage source via a first switching component. In some cases, writing the second value further includes: coupling a plate of the second ferroelectric cell to a ground node or a virtual ground node via a first switching component.

Read manager 840 may sense the first value from the first ferroelectric cell, sense the second value from the second ferroelectric cell, activate a first isolation component positioned between the first ferroelectric cell and the sense component, and activate a second isolation component positioned between the second ferroelectric cell and the sense component. In some cases, sensing the first value further includes: applying a first voltage to a plate of the first ferroelectric cell. In some cases, sensing the second value further includes: applying a second voltage to a plate of the second ferroelectric cell. In some cases, activating the first isolation component further includes: coupling the first ferroelectric cell and a ferroelectric capacitor associated with the first ferroelectric cell to the sense component via the first isolation component.

Pre/EQ manager 845 may precharge the first ferroelectric cell and the second ferroelectric cell before performing an access operation using the first ferroelectric cell and the second ferroelectric cell and couple a plate of the second ferroelectric cell and an access line of the second ferroelectric cell to the ground node or the virtual ground node. In some cases, precharging the first ferroelectric cell and the second ferroelectric cell further includes: coupling a plate of the first ferroelectric cell and an access line of the first ferroelectric cell to a ground node or a virtual ground node.

Figure 9:
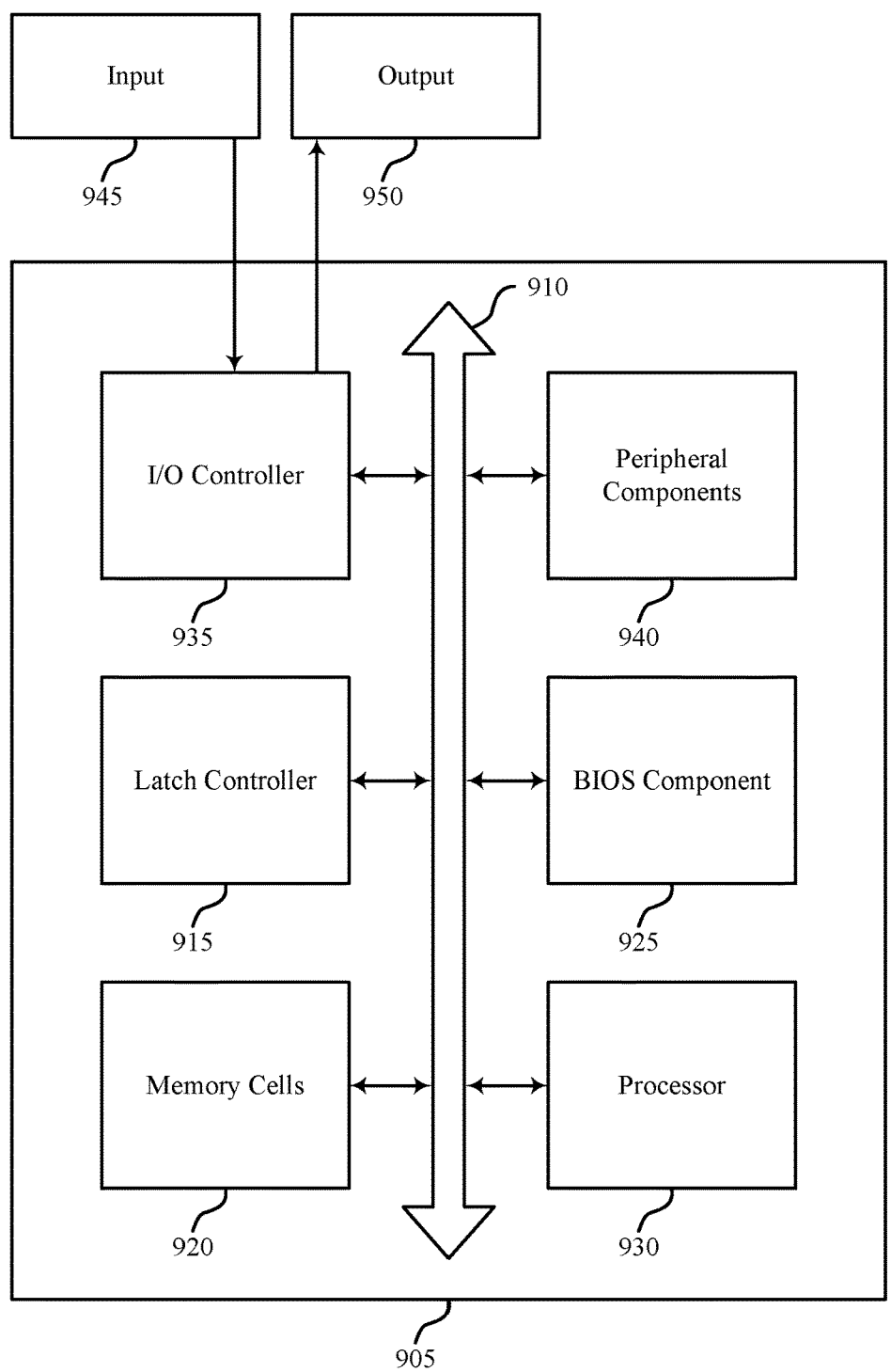
FIG. 9 illustrates a block diagram of a system including a latch controller that supports a reprogrammable non-volatile latch in accordance with embodiments of the present disclosure.

FIG. 9 shows a diagram of a system 900 including a device 905 that supports a reprogrammable non-volatile latch in accordance with various embodiments of the present disclosure. Device 905 may be an example of or include the components of latch controller 775, 815 as described with reference to FIGS. 7 and 8 or a memory controller 140, 715 as described above, e.g., with reference to FIGS. 1 and 7. Device 905 may include components for bi-directional voice and data communications including components for transmitting and receiving communications, including latch controller 915, memory cells 920, basic input/output system (BIOS) component 925, processor 930, I/O controller 935, and peripheral components 940. These components may be in electronic communication via one or more busses (e.g., bus 910).

Latch controller 915 may operate one or more memory cells as described herein. Specifically, latch controller 915 may be configured to support reprogrammable non-volatile latch, such as the ferroelectric latch 415, 505, or 750 described with reference to FIGS. 4, 5, and 7. In some cases, latch controller 915 may include a row decoder, column decoder, or both, as described with reference to FIG. 1 (not shown).

Memory cells 920 may store information (i.e., in the form of a logical state) as described herein. The memory cells 920 may also include the ferroelectric latch 415, 505, or 750 described with reference to FIGS. 4, 5, and 7.

BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a digital signal processor (DSP), a central processing unit (CPU), a microcontroller, an application-specific integrated circuit (ASIC), an field-programmable gate array (FPGA), a programmable logic device, a discrete gate or transistor logic component, a discrete hardware component, or any combination thereof). In some cases, processor 930 may be configured to operate an array of ferroelectric memory cells using a memory controller or a latch controller. In other cases, a memory controller or a latch controller may be integrated into processor 930. Processor 930 may be configured to execute computer-readable instructions stored in a memory to perform various functions (e.g., functions or tasks supporting reprogrammable non-volatile latch). 930.

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion of such a device.

Figure 10:
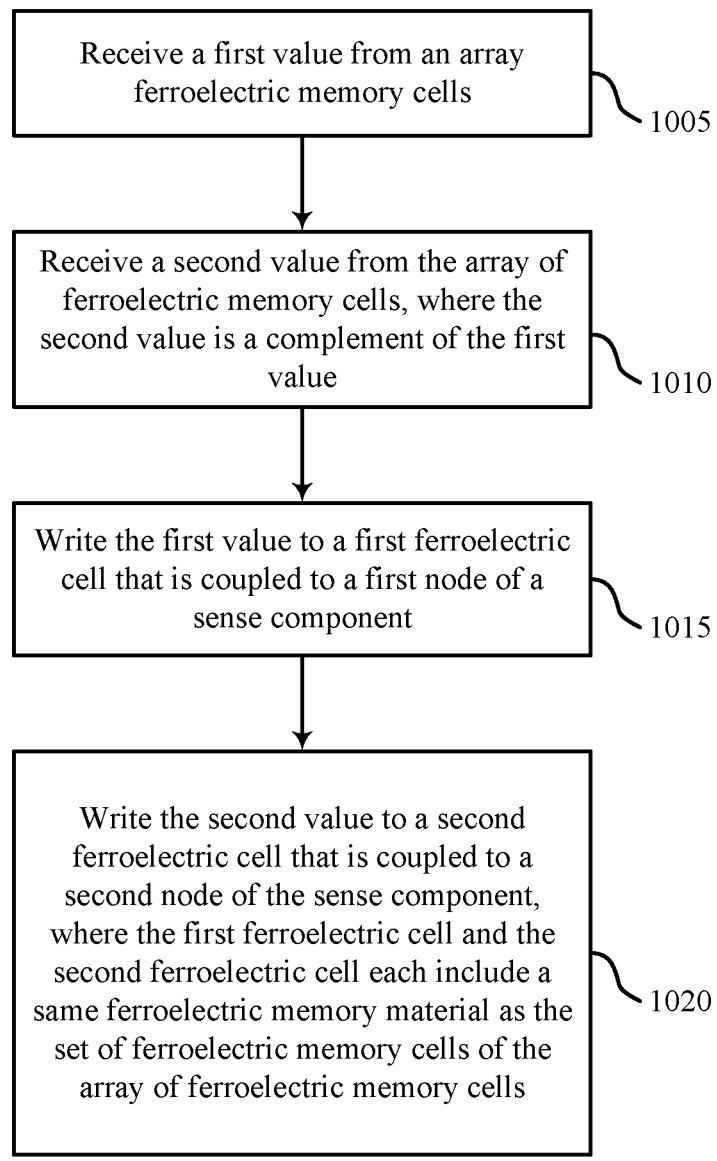
FIGS. 10 through 11 illustrate methods for reprogrammable non-volatile latch in accordance with embodiments of the present disclosure.

FIG. 10 shows a flowchart illustrating a method 1000 for reprogrammable non-volatile latch in accordance with various embodiments of the present disclosure. The operations of method 1000 may be implemented by a memory controller 140, a latch controller 775, or their components as described herein. For example, the operations of method 1000 may be performed by a memory controller as described with reference to FIGS. 7 through 9 or a latch controller 775, 815, 915 as described with reference to FIGS. 7 through 9. In some examples, a memory controller 140 or a latch controller 775 may execute a set of codes to control the functional elements of the device to perform the functions described herein. Additionally or alternatively, the memory controller 140 or the latch controller 775 may perform functions described herein using special-purpose hardware.

In some cases, the method may also include receiving a first value from an array of ferroelectric memory cells. In some cases, the method may also include coupling a plate of the second ferroelectric cell and an access line of the second ferroelectric cell to the ground node or the virtual ground node. In some cases, the method may also include writing the first value to a first ferroelectric cell that is coupled to a first node of a sense component. In some cases, the method may also include writing the second value to a second ferroelectric cell that is coupled to a second node of the sense component, wherein the first ferroelectric cell and the second ferroelectric cell each comprise a same ferroelectric memory material as the plurality of ferroelectric memory cells of the array of ferroelectric memory cells. In some cases, the method may also include sensing the first value from the first ferroelectric cell. In some cases, the method may also include sensing the second value from the second ferroelectric cell. In some cases, the method may also include outputting a stored value determined by the sense component to the array of ferroelectric memory cells, wherein the stored value is based at least in part on the first value and the second value. In some cases, sensing the first value further comprises: applying a first voltage to a plate of the first ferroelectric cell. In some cases, the method may also include activating a first isolation component positioned between the first ferroelectric cell and the sense component. In some cases, sensing the second value further comprises: applying a second voltage to a plate of the second ferroelectric cell. In some cases, the method may also include activating a second isolation component positioned between the second ferroelectric cell and the sense component. In some cases, the method may also include receiving a second value from the array of ferroelectric memory cells, wherein the second value is a complement of the first value. In some cases, the stored value is output to the array of ferroelectric memory cells at a conductive line positioned between the first ferroelectric cell and the sense component. In some cases, writing the first value further comprises: coupling a plate of the first ferroelectric cell to a voltage source via a first switching component. In some cases, the method may also include coupling an access line of the first ferroelectric cell to a ground node or virtual ground node via a second switching component. In some cases, writing the second value further comprises: coupling a plate of the second ferroelectric cell to a ground node or a virtual ground node via a first switching component. In some cases, the method may also include coupling an access line of the second ferroelectric cell to a voltage source via a second switching component. In some cases, the method may also include isolating the first ferroelectric cell from the sense component via a first isolation component while writing the first value. In some cases, the method may also include isolating the second ferroelectric cell from the sense component via a second isolation component while writing the second value. In some cases, the method may also include precharging the first ferroelectric cell and the second ferroelectric cell before performing an access operation using the first ferroelectric cell and the second ferroelectric cell. In some cases, precharging the first ferroelectric cell and the second ferroelectric cell further comprises: coupling a plate of the first ferroelectric cell and an access line of the first ferroelectric cell to a ground node or a virtual ground node. In some cases, activating the first isolation component further comprises: coupling the first ferroelectric cell and a ferroelectric capacitor associated with the first ferroelectric cell to the sense component via the first isolation component.

At block 1005 the latch controller 775 may receive a first value from an array of ferroelectric memory cells. The operations of block 1005 may be performed according to the methods described with reference to FIGS. 1 through 6. In certain examples, some of the operations of block 1005 may be performed by a communication manager as described with reference to FIGS. 7 through 9.

At block 1010 the latch controller 775 may receive a second value from the array of ferroelectric memory cells, wherein the second value is a complement of the first value. The operations of block 1010 may be performed according to the methods described with reference to FIGS. 1 through 6. In certain examples, some of the operations of block 1010 may be performed by a communication manager as described with reference to FIGS. 7 through 9.

At block 1015 the latch controller 775 may write the first value to a first ferroelectric cell that is coupled to a first node of a sense component. The operations of block 1015 may be performed according to the methods described with reference to FIGS. 1 through 6. In certain examples, some of the operations of block 1015 may be performed by a write manager as described with reference to FIGS. 7 through 9.

At block 1020 the latch controller 775 may write the second value to a second ferroelectric cell that is coupled to a second node of the sense component, wherein the first ferroelectric cell and the second ferroelectric cell each comprise a same ferroelectric memory material as the plurality of ferroelectric memory cells of the memory array. The operations of block 1020 may be performed according to the methods described with reference to FIGS. 1 through 6. In certain examples, some of the operations of block 1020 may be performed by a write manager as described with reference to FIGS. 7 through 9.

Figure 11:
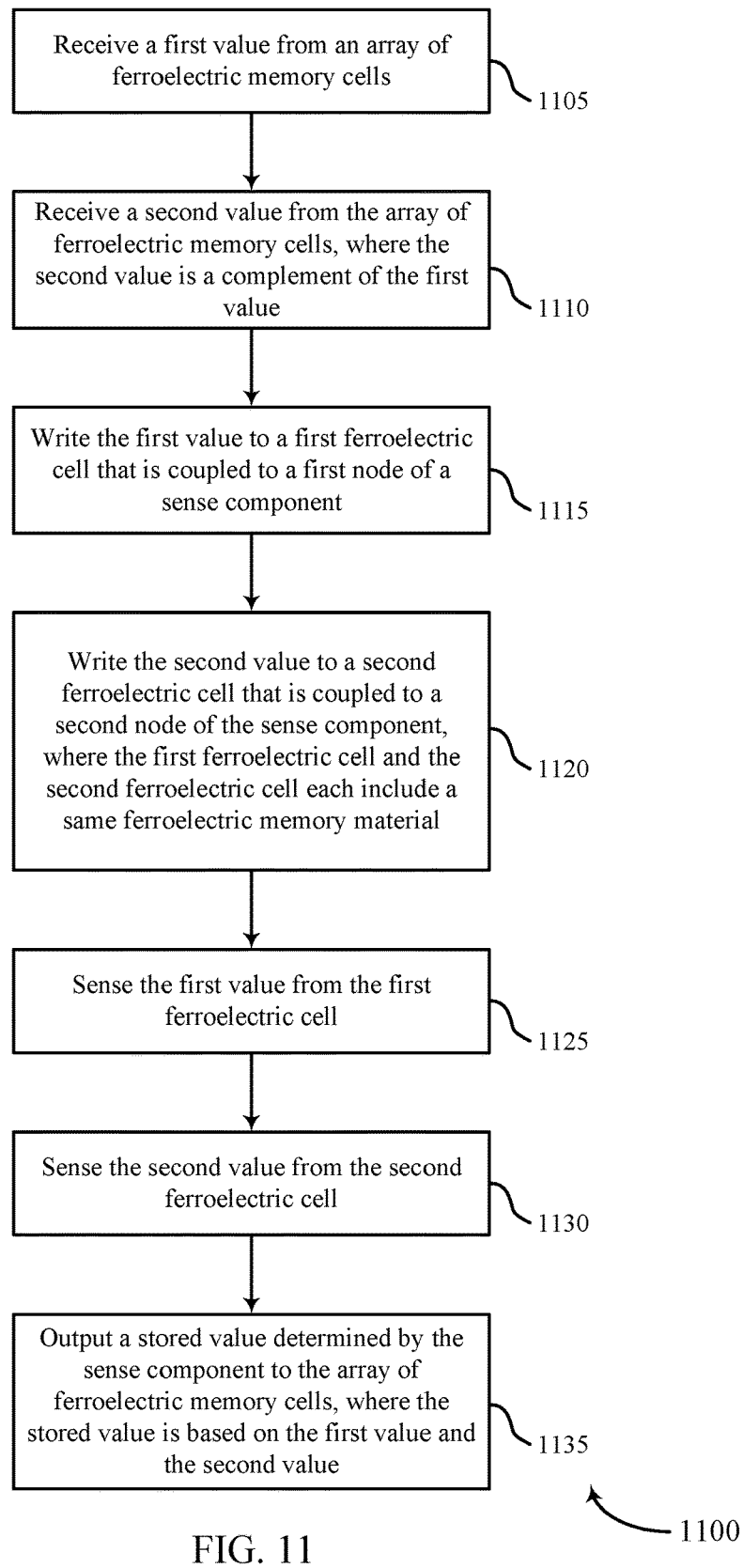

FIG. 11 shows a flowchart illustrating a method 1100 for reprogrammable non-volatile latch in accordance with various embodiments of the present disclosure. The operations of method 1100 may be implemented by a memory controller 140, a latch controller 775, or their components as described herein. For example, the operations of method 1100 may be performed by a memory controller as described with reference to FIGS. 7 through 9 or a latch controller 775, 815, 915 as described with reference to FIGS. 7 through 9. In some examples, a memory controller 140 or a latch controller 775 may execute a set of codes to control the functional elements of the device to perform the functions described herein. Additionally or alternatively, the memory controller 140 or the latch controller 775 may perform functions described herein using special-purpose hardware.

In some cases, the method may also include receiving a first value from a memory array that includes a plurality of ferroelectric memory cells. In some cases, the method may also include receiving a second value from the memory array, wherein the second value is a complement of the first value. In some cases, the method may also include writing the first value to a first ferroelectric cell that is coupled to a first node of a sense component. In some cases, the method may also include writing the second value to a second ferroelectric cell that is coupled to a second node of the sense component, wherein the first ferroelectric cell and the second ferroelectric cell each comprise a same ferroelectric memory material as the plurality of ferroelectric memory cells of the memory array. In some cases, the method may also include sensing the first value from the first ferroelectric cell. In some cases, the method may also include sensing the second value from the second ferroelectric cell. In some cases, the method may also include outputting a stored value determined by the sense component to the memory array, wherein the stored value is based at least in part on the first value and the second value.

At block 1105 the latch controller 775 may receive a first value from an array of ferroelectric memory cells. The operations of block 1105 may be performed according to the methods described with reference to FIGS. 1 through 6. In certain examples, some of the operations of block 1105 may be performed by a communication manager as described with reference to FIGS. 7 through 9.

At block 1110 the latch controller 775 may receive a second value from the array of ferroelectric memory cells, wherein the second value is a complement of the first value. The operations of block 1110 may be performed according to the methods described with reference to FIGS. 1 through 6. In certain examples, some of the operations of block 1110 may be performed by a communication manager as described with reference to FIGS. 7 through 9.

At block 1115 the latch controller 775 may write the first value to a first ferroelectric cell that is coupled to a first node of a sense component. The operations of block 1115 may be performed according to the methods described with reference to FIGS. 1 through 6. In certain examples, some of the operations of block 1115 may be performed by a write manager as described with reference to FIGS. 7 through 9.

At block 1120 the latch controller 775 may write the second value to a second ferroelectric cell that is coupled to a second node of the sense component, wherein the first ferroelectric cell and the second ferroelectric cell each comprise a same ferroelectric memory material as the plurality of ferroelectric memory cells of the memory array. The operations of block 1120 may be performed according to the methods described with reference to FIGS. 1 through 6. In certain examples, some of the operations of block 1120 may be performed by a write manager as described with reference to FIGS. 7 through 9.

At block 1125 the latch controller 775 may sense the first value from the first ferroelectric cell. The operations of block 1125 may be performed according to the methods described with reference to FIGS. 1 through 6. In certain examples, some of the operations of block 1125 may be performed by a read manager as described with reference to FIGS. 7 through 9.

At block 1130 the latch controller 775 may sense the second value from the second ferroelectric cell. The operations of block 1130 may be performed according to the methods described with reference to FIGS. 1 through 6. In certain examples, some of the operations of block 1130 may be performed by a read manager as described with reference to FIGS. 7 through 9.

At block 1135 the latch controller 775 may output a stored value determined by the sense component to the array of ferroelectric memory cells, wherein the stored value is based at least in part on the first value and the second value. The operations of block 1135 may be performed according to the methods described with reference to FIGS. 1 through 6. In certain examples, some of the operations of block 1135 may be performed by a communication manager as described with reference to FIGS. 7 through 9.

It should be noted that the methods described above describe possible implementations, and that the operations and the steps may be rearranged or otherwise modified and that other implementations are possible. Furthermore, features, elements, or steps from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The term "electronic communication" and "couple" refers to a relationship between components that supports electron flow between the components. This may include a direct connection between components or may include intermediate components. Components in electronic communication or components that are coupled may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The terms "exemplary" or "embodiment," as may be used herein means, "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An electronic memory apparatus, comprising;
an array of memory cells;
a controller in electronic communication with the array of memory cells; and
a latch in electronic communication with the controller and exclusive of the array of memory cells, the latch including:
   a first ferroelectric cell in electronic communication with a sense component via a first conductive line;
   a second ferroelectric cell in electronic communication with the sense component via a second conductive line;
   a switching component configured to selectively couple the first conductive line with a voltage source;
   a second switching component configured to selectively couple the first conductive line with a ground node; and
   a first isolation component positioned between the switching component and the sense component and positioned between the second switching component and the sense component.

2. The electronic memory apparatus of claim 1, wherein the switching component is configured to selectively couple the first conductive line with the voltage source.

3. The electronic memory apparatus of claim 2,
wherein the second switching component is configured to selectively couple the first conductive line with the ground node.

4. The electronic memory apparatus of claim 1,
wherein the first isolation component is positioned between the first ferroelectric cell and the sense component, the first isolation component configured to isolate the sense component from the first ferroelectric cell.

5. The apparatus of claim 1, wherein the controller is configured to access the latch faster than the controller is configured to access the array of memory cells.

6. The electronic memory apparatus of claim 1, wherein the latch further comprises:
   a first ferroelectric capacitor coupled between the voltage source and the first conductive line; and
   a second ferroelectric capacitor coupled between the voltage source and the second conductive line, wherein the first ferroelectric capacitor and the second ferroelectric capacitor each comprise the same ferroelectric material as the first ferroelectric cell and the second ferroelectric cell.

7. The electronic memory apparatus of claim 1, wherein:
   a plate of the first ferroelectric cell is coupled with the voltage source via a first switching component and with the ground node via the second switching component; and
   a plate of the second ferroelectric cell is coupled with the voltage source via a third switching component and with the ground node via a fourth switching component.

8. The electronic memory apparatus of claim 1, wherein at least one of the first conductive line or the second conductive line is configured as an input or an output of the latch.

9. The electronic memory apparatus of claim 1, wherein the array of memory cells includes a plurality of ferroelectric memory cells.

10. A method, comprising:
receiving a first value from an array of ferroelectric memory cells;
receiving a second value from the array of ferroelectric memory cells;
activating a first switching component to couple a conductive line with a voltage source;
writing the first value to a first ferroelectric cell in electronic communication with a first node of a sense component, wherein writing the first value further comprises coupling an access line of the first ferroelectric cell to a ground node via a second switching component;
isolating the first ferroelectric cell from the sense component via a first isolation component while writing the first value, wherein the first isolation component is positioned between the first switching component and the sense component and positioned between the second switching component and the sense component;
writing the second value to a second ferroelectric cell in electronic communication with a second node of the sense component, wherein a latch exclusive of the array of ferroelectric memory cells comprises the first ferroelectric cell and the second ferroelectric cell; and
coupling the conductive line that connects the first ferroelectric cell with the first node of the sense component to the voltage source or the ground node based at least in part on a logic state of the first value being written to the first ferroelectric cell.

11. The method of claim 10, further comprising:
sensing the first value from the first ferroelectric cell;
sensing the second value from the second ferroelectric cell; and
outputting a stored value determined by the sense component to the array of ferroelectric memory cells, wherein the stored value is based at least in part on the first value and the second value.

12. The method of claim 11, wherein sensing the first value further comprises:
applying a first voltage to a plate of the first ferroelectric cell; and
coupling, using the first isolation component, the first ferroelectric cell with the sense component.

13. The method of claim 11, wherein sensing the second value further comprises:
applying a second voltage to a plate of the second ferroelectric cell; and
coupling, using a second isolation component, the second ferroelectric cell with the sense component.

14. The method of claim 10, wherein writing the first value further comprises:
coupling a plate of the first ferroelectric cell to the voltage source via the first switching component.

15. The method of claim 10, further comprising:
isolating the second ferroelectric cell from the sense component via a second isolation component while writing the second value.

16. The method of claim 10, further comprising:
precharging the first ferroelectric cell and the second ferroelectric cell before performing an access operation using the first ferroelectric cell and the second ferroelectric cell.

17. The method of claim 16, wherein precharging the first ferroelectric cell and the second ferroelectric cell further comprises:
- coupling a plate of the first ferroelectric cell and the access line of the first ferroelectric cell to the ground node; and
- coupling a plate of the second ferroelectric cell and an access line of the second ferroelectric cell to the ground node.

18. An electronic memory apparatus, comprising:
- an array of ferroelectric memory cells;
- a latch exclusive of the array of ferroelectric memory cells and comprising a first ferroelectric cell and a second ferroelectric cell;
- a switching component configured to selectively couple a conductive line with a voltage source;
- a second switching component configured to selectively couple the conductive line with a ground node; and
- a sense component in electronic communication with the first ferroelectric cell and the second ferroelectric cell;
- a first isolation component positioned between the switching component and the sense component and positioned between the second switching component and the sense component; and
- a controller in electronic communication with a plurality of transistors, wherein the controller is operable to:
  - sense a first value from the first ferroelectric cell;
  - sense a second value from the second ferroelectric cell;
  - output a stored value determined by the sense component to the array of ferroelectric memory cells; and
  - couple the conductive line that connects the first ferroelectric cell with a first node of the sense component to the voltage source or the ground node based at least in part on a logic state of the first value being written to the first ferroelectric cell.

19. The electronic memory apparatus of claim 18, wherein the controller is further operable to:
- isolate the first ferroelectric cell from the sense component via the first isolation component while writing the first value; and
- isolate the second ferroelectric cell from the sense component via a second isolation component while writing the second value.

* * * * *